(12) United States Patent
Jong et al.

(10) Patent No.: US 6,727,172 B1
(45) Date of Patent: Apr. 27, 2004

(54) PROCESS TO REDUCE CHEMICAL MECHANICAL POLISHING DAMAGE OF NARROW COPPER LINES

(75) Inventors: Shwangming Jong, Hsin-Chu (TW); Syun-Ming Jang, Hsin-Chu (TW); Wen-Chih Chiou, Miaoli (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 56 days.

(21) Appl. No.: 10/170,242

(22) Filed: Jun. 12, 2002

(51) Int. Cl.[7] .......................................... H01L 21/4763
(52) U.S. Cl. ....................... 438/626; 438/627; 438/629; 438/631; 438/633; 438/643; 438/645; 438/653; 438/660; 438/672; 438/687; 438/692
(58) Field of Search ...................... 438/622, 625–627, 438/629, 631, 633, 643, 645, 648, 653, 656, 660, 672, 687

(56) References Cited

U.S. PATENT DOCUMENTS

| | | | |
|---|---|---|---|
| 5,527,739 A | 6/1996 | Parrillo et al. ............... | 437/198 |
| 5,976,970 A | * 11/1999 | Dalal et al. .................. | 438/660 |
| 6,015,749 A | 1/2000 | Liu et al. ..................... | 438/628 |
| 6,022,808 A | 2/2000 | Nogami et al. .............. | 438/694 |
| 6,030,895 A | 2/2000 | Joshi et al. .................. | 438/679 |
| 6,071,810 A | * 6/2000 | Wada et al. ................. | 438/660 |

* cited by examiner

Primary Examiner—Lynne Gurley
(74) Attorney, Agent, or Firm—George O. Saile; Stephen B. Ackerman

(57) ABSTRACT

A method of forming a narrow copper line structure, embedded in an opening in an insulator layer, in which the defect count of the narrow copper line structure is minimized, has been developed. The method features a combination of processes applied to a copper layer prior to subjection of the copper layer to a chemical mechanical polishing, (CMP), procedure, used to define the narrow copper line structure. A thin compressive layer is first formed on the top surface of the copper layer, followed by a low temperature anneal. These procedures increase the number of nucleation sites, and grain size of the copper layer, resulting in less damage to the treated copper layer, as a result of a subsequent CMP procedure, when compared to counterpart copper layers, subjected to the same CMP procedure, however without experiencing the overlying, thin compressive layer, followed by the low temperature anneal.

26 Claims, 3 Drawing Sheets

PROCESS TO REDUCE CHEMICAL MECHANICAL POLISHING DAMAGE OF NARROW COPPER LINES

BACKGROUND OF INVENTION (1) Field of the Invention

The present invention relates to methods used to fabricate semiconductor devices, and more specifically to a method used to form copper contact, and interconnect structures.

(2) Description of Prior Art

To increase the performance of semiconductor devices, low resistivity copper has replaced traditionally used metals such as aluminum and tungsten, for use as contact structures, or for interconnect lines. The low resistivity of copper, again compared to other metals such as aluminum, or tungsten, has also allowed thinner and narrower metal structures to be used, allowing a greater number of smaller, and higher device density semiconductor chips to be obtained from a specific size starting substrate, thus reducing the fabrication cost of a specific semiconductor chip. The use of copper structures however can present specific problems not always encountered when using other metals. For example when copper is subjected to a chemical mechanical polishing, (CMP), procedure, to define a copper structure, or line, embedded in an opening in an insulator layer, damage, or defects in the copper structure can result. These defects in turn can present yield loss, as a result of opens or shorts, or reliability concerns in terms of electromigration. This invention will present a process sequence that will allow the copper layer to experience the CMP definition procedure, without defect generation. Prior art, such as Liu et al, in U.S. Pat. No. 6,015,749, show a method of fabricating copper structures, however that prior art does not describe the unique process sequence presented in this present invention, featuring unique preparation of the copper layer, prior to a subsequent CMP procedure.

SUMMARY OF THE INVENTION

It is an object of this invention to define a copper structure via a chemical mechanical polishing, (CMP), procedure.

It is another object of this invention to deposit a thin, compressive layer on a copper layer, prior to performing the CMP definition procedure.

It is still another object of this invention to perform a low temperature anneal, to a copper layer, and the overlying, thin compressive stress layer, prior to performing the CMP definition procedure.

In accordance with the present invention a method of reducing the defects in a copper structure, formed in an opening in an insulator layer, via a CMP procedure, is described. After creating an opening in an insulator layer, exposing a portion of the top surface of an underlying conductive region, a barrier layer is deposited, followed by the electro-chemical deposition, (ECD), of copper, completely filling the opening in the insulator layer. A thin, compressive stress layer is next deposited on the top surface of the copper layer, followed by a low temperature anneal. This combination results in the formation of nucleation sites, as well as optimum growth of copper grains, allowing a subsequent CMP procedure to remove regions of the thin barrier layer, and of the copper layer, from the top surface of the insulator layer, forming an embedded copper structure in the opening in the insulator layer. The embedded copper structure exhibits less defects than counterpart CMP defined copper structures, formed without the combination of a low compressive stress layer and a low temperature anneal.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
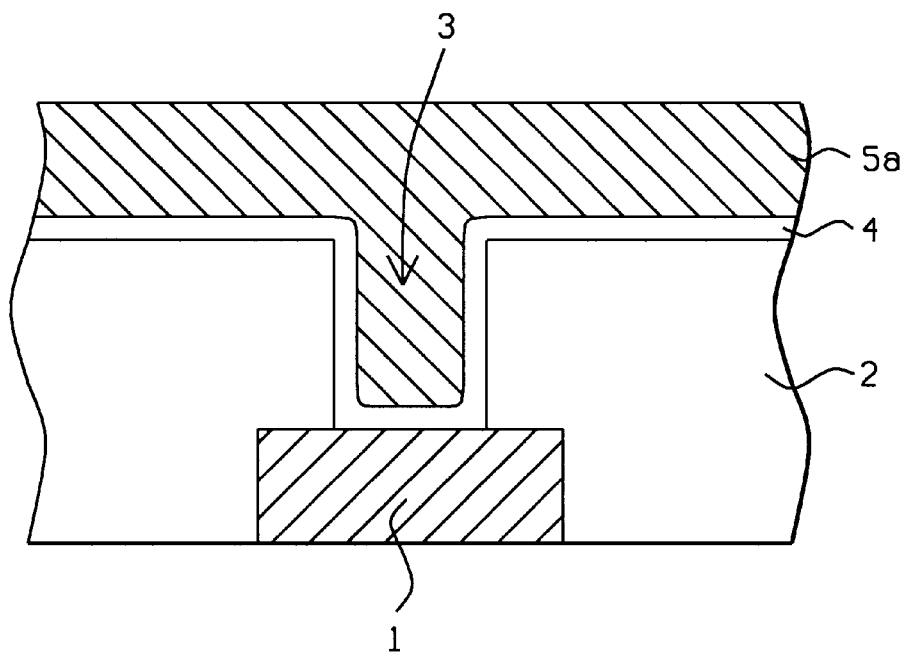
FIGS. 1–4, which schematically, in cross-sectional style, show the key fabrication stages used to define a copper structure, in an opening in an insulator, via a CMP procedure, in which a copper layer is subjected to a combination of process steps prior to the CMP procedure.

The method of fabricating a copper structure, embedded in an opening in an insulator layer, featuring a combination of treatments applied to a copper layer prior to definition of the copper layer via a CMP procedure, will now be described in detail. A conductive region 1, such as an underlying metal interconnect structure, or a metal plug structure, is provided and shown schematically in FIG. 1. Insulator layer 2, such as silicon oxide, or borophosphosilicate glass (BPSG), or carbon doped silicon oxide is deposited via low pressure chemical vapor deposition, (LPCVD), or via plasma enhanced chemical vapor deposition, (PECVD), procedures, to a thickness between about 2000 to 5000 Angstroms. A chemical mechanical polishing, (CMP), procedure is next employed for planarization purposes, resulting in a smooth top surface topography for insulator layer 2. Conventional photolithographic and reactive ion etching, (RIE), procedures, using $CHF_3$ as an etchant for insulator layer 2, are used to create opening 3, in insulator layer 2, exposing a portion of the top surface of conductive region 1. This is schematically shown in FIG. 1. Opening 3, is formed with a width between about 1500 to 2500 Angstroms. After removal of the photoresist shape used for definition of opening 3, via plasma oxygen ashing and careful wet cleans, a barrier layer 4, such as tantalum nitride, or titanium nitride, and followed by a seed copper layer, is deposited via plasma vapor deposition, (PVD), procedures, to a thickness between about 200 to 500 Angstroms. Barrier layer 4, coats all the exposed surfaces of opening 3, including coating of the exposed portion of conductive region 1, in opening 3, as well as coating the top surface of insulator layer 2. Copper layer 5a, is next deposited, via electro-chemical deposition, (ECD), procedures, to a thickness between about 6000 to 9000 Angstroms, completely filling opening 3, as well as overlying the portion of barrier layer 4, which resides on the top surface of insulator layer 2. This is schematically shown in FIG. 1.

To form a subsequent copper structure in opening 3, CMP procedures are used to selectively remove the regions of copper layer 5a, as well as the regions of barrier layer 4, from the top surface of insulator layer 2. However subjection of the as-deposited copper layer to CMP procedures can result in the generation of defects in the copper structure. These defects in the form of voids, holes, tears, etc, can result in yield losses, if the holes or tears are extensive enough to result in metal opens, or these defects can result in reliability failures, in terms of electromigration. The increased current density in copper structures exhibiting CMP induced voids or defects, can result in earlier than anticipated metal line wear out. Therefore a combination of process steps has been developed, and applied to copper layer 5a, prior to the CMP procedure, resulting in a copper layer that is less susceptible to CMP generated defects. The process sequence, next described, and shown schematically in FIGS. 2–3, results in the formation of nucleation sites, and grain size growth, in the copper layer, which allows the copper layer to experience the subsequent CMP procedure with less defect generation than counterparts fabricated without this unique process sequence.

Figure 2:
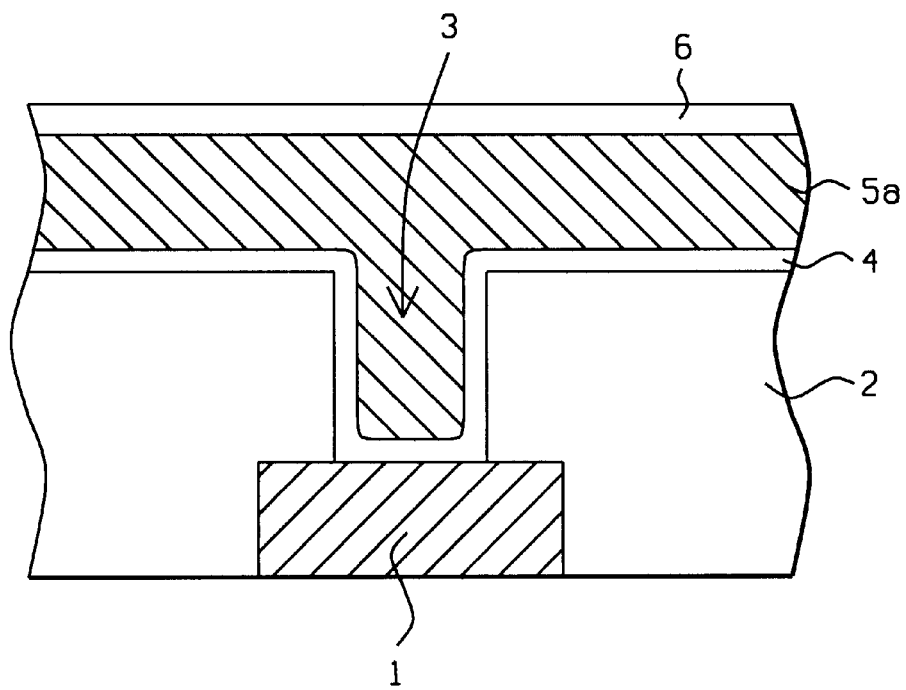
Figure 3:
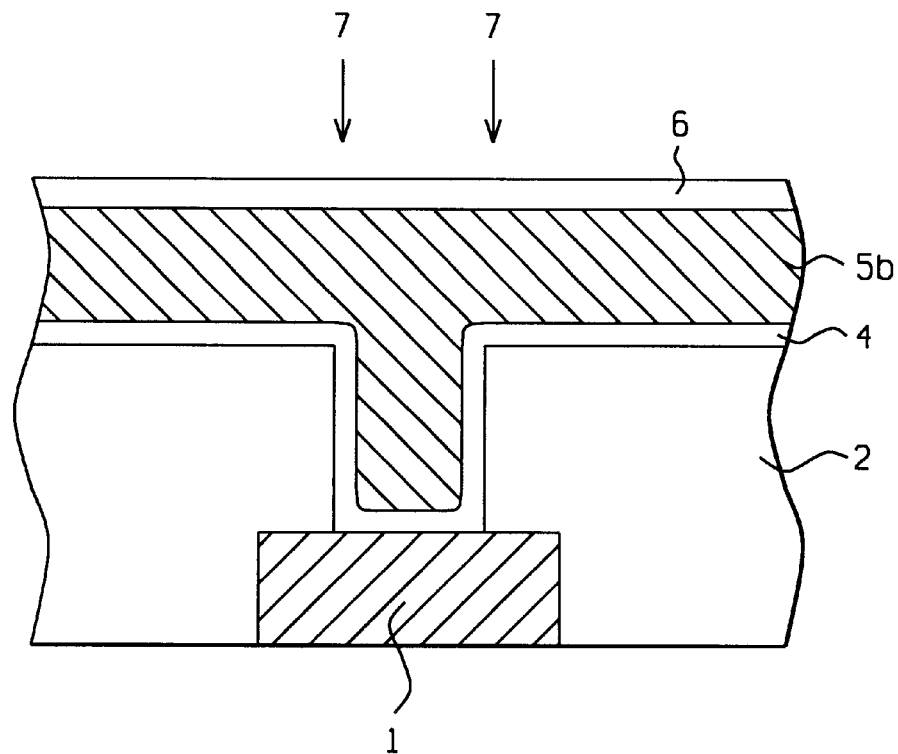

A thin layer 6, comprised with a compressive stress, is deposited on the top surface of copper layer 5a. Thin layer 6, can be a silicon oxynitride, or silicon nitride layer, obtained via LPCVD or PECVD procedures, to a thickness between about 200 to 500 Angstroms, or layer 6, can be a tantalum nitride layer, obtained via PVD procedures, again to a thickness between 200 to 500 Angstroms. In addition thin layer 6, can also be a $CuSi_x$ layer, at a thickness between about 200 to 500 Angstroms, obtained via subjecting copper layer 5a, to a silane flow, at a temperature greater than 350° C. All candidates for thin layer 6, shown schematically in FIG. 2, are comprised with a compressive stress between about 1E9 to 3E9 dynes/cm$^2$. After deposition or formation of thin, compressive layer 6, a critical anneal procedure 7, described schematically in FIG. 3, is performed, in a nitrogen—hydrogen ambient, at a temperature between about 200 to 300° C., for a time between about 15 to 45 min. The anneal procedure 7, in combination with overlying compressive, thin layer 6, converts copper layer 5a, to copper layer 5b, which is now is comprised with increased nucleation sites, and a larger copper grain size, then copper layer 5a. The altered structure of copper layer 5b, will allow a subsequent CMP procedure to be performed with reduced defect formation to the defined copper structure, when compared to copper structures formed via a CMP procedure applied to counterpart copper layers that did not experience the combination of an overlying, thin compressive layer, and the low temperature anneal.

Figure 4:
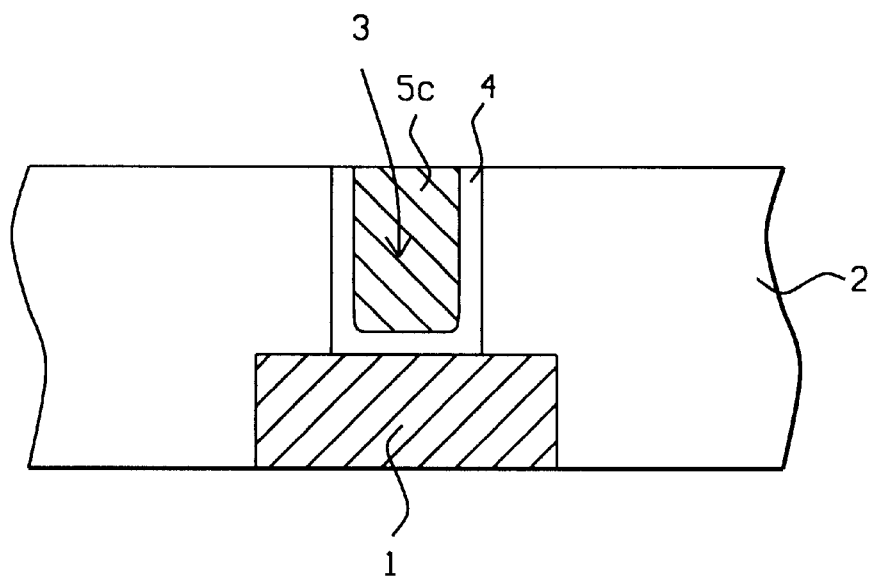
Figure 5:
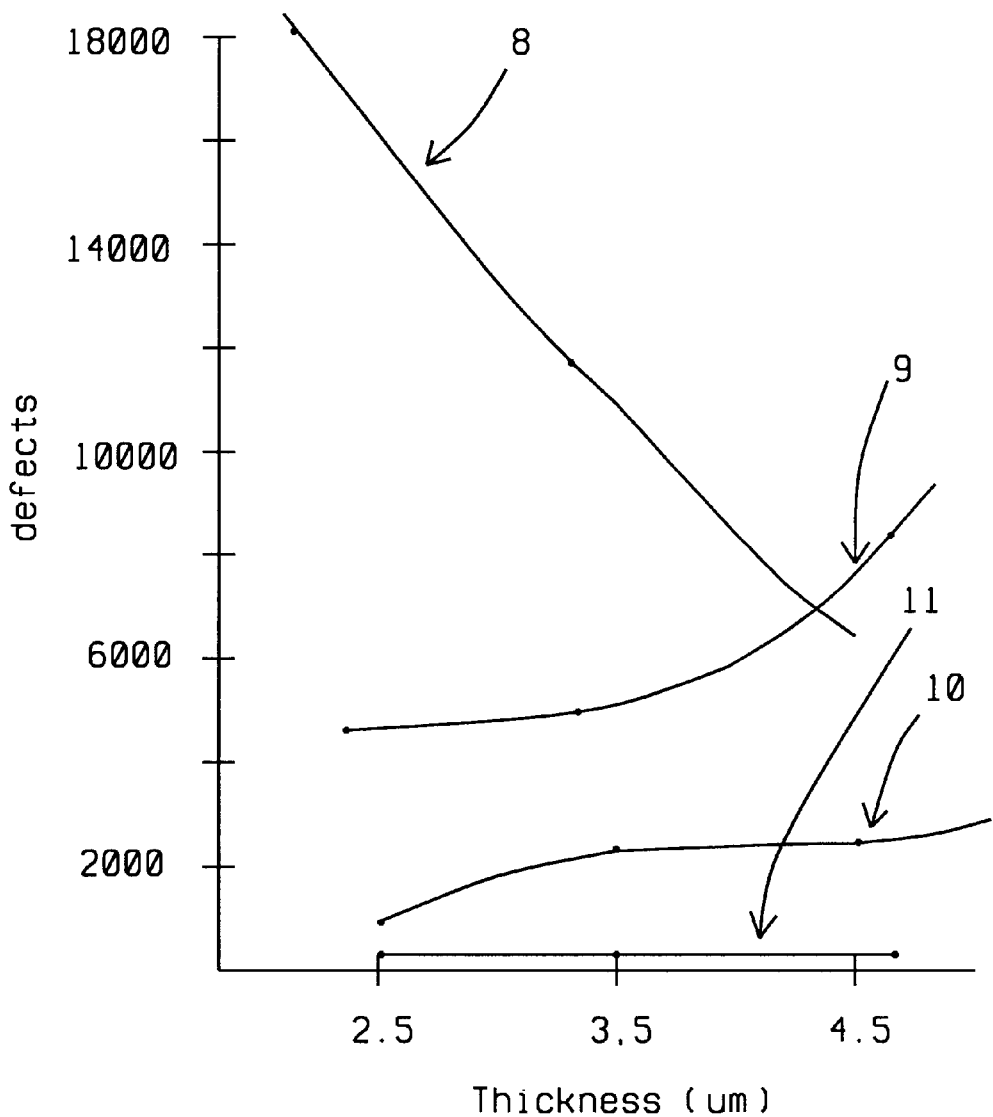
FIG. 5, which graphically represents the defect counts of copper structures, defined via a CMP procedure, as a function of the thickness of the copper structure and the treatment applied to a copper layer, prior to CMP definition.

The CMP procedure is next used to remove thin layer 6, and portions of copper layer 5b, and portions of barrier layer 4, from the top surface of insulator layer 2, resulting in narrow copper line structure 5c, shown schematically in FIG. 4, embedded in opening 3, featuring a width identical to the width of opening 3, between about 1500 to 2500 Angstroms. Narrow copper line structure 5c, fabricated using the procedures taught in this invention, has a level of defect counts, as measured via KLA, of less than 100 defect counts. Counterpart, narrow line, copper structures, fabricated from copper layers not subjected to the combination of overlying materials and anneals described in this invention result in defect counts greater than 1000. FIG. 5, graphically shows the defect counts of several narrow line copper structures, as a function of the thickness of the copper structure. Narrow copper line structure 8, formed from a copper layer only subjected to an anneal, at a temperature of about 350° C., for about 3 min, results in defect counts between about 6000 to 18000, while narrow copper structure 9, formed from a copper layer receiving no treatment also resulted in high defect counts, between about 4000 to 10000. An anneal treatment at a temperature of about 250° C., for about 30 min, applied to a copper layer resulted in narrow copper line structure 10, with a defect count between 400 to 2000, while the novel combination of an overlying, compressive thin layer and a low temperature anneal, applied to a copper layer prior to the CMP definition procedure, resulted in the desired narrow copper line structure 11, featuring a defect count of less then 100.

While this invention has been particularly shown and described with reference to the preferred embodiments thereof, it will be understood by those skilled in the art that various changes in form and details may be made without departing from the spirit or scope of the invention.

What is claimed is:

1. A method of fabricating a copper structure, on a semiconductor substrate, comprising the steps of:
   forming an opening in an insulator layer, exposing a portion of a top surface of an underlying conductive region, located at the bottom of said opening;
   depositing a barrier layer;
   depositing a thick copper layer, between about 6000 to 9000 Angstroms in thickness, completely filling said opening, in said insulator layer, and with a portion of said thick copper layer residing on the top surface of said barrier layer in a region in which said barrier layer overlays the top surface of said insulator layer;
   forming a thin compressive layer between about 200 to 500 Angstroms in thickness, on the top surface of said copper layer;
   performing an anneal procedure; and
   removing said thin compressive layer, removing the portion of said thick copper layer from the top surface of said barrier layer, and removing the portion of said barrier layer from the top surface of said insulator layer, creating said copper structure, in said opening in said insulator layer.

2. The method of claim 1, wherein said insulator layer is either a silicon oxide layer, a borophosphosilicate glass (BPSG) layer, or a carbon doped silicon oxide layer, each obtained via LPCVD or PECVD procedures, at a thickness between about 2000 to 5000 Angstroms.

3. The method of claim 1, wherein said opening in said insulator layer, is created via a RIE procedure, using $CHF_3$ as an etchant for said insulator layer.

4. The method of claim 1, wherein the width of said opening, in said insulator layer, is between about 1500 to 2500 Angstroms.

5. The method of claim 1, wherein said barrier layer is either a tantalum nitride, or a titanium nitride layer, obtained via plasma vapor deposition procedures at a thickness between about 200 to 500 Angstroms.

6. The method of claim 1, wherein said thick copper layer is obtained via electro-chemical deposition procedures.

7. The method of claim 1, wherein said thin compressive layer is either a silicon oxynitride layer, or a silicon nitride layer, obtained via LPCVD or PECVD procedures, and with a compressive stress between about 1E9 to 3E9 dynes/cm$^2$.

8. The method of claim 1, wherein said thin compressive layer is a tantalum nitride layer, obtained via plasma vapor deposition procedures, with a compressive stress between about 1E9 to 3E9 dynes/cm$^2$.

9. The method of claim 1, wherein said thin compressive layer is a $CuSi_x$ layer, with a compressive stress between about 1E9 to 3E9 dynes/cm$^2$, obtained via exposure of copper to a silane ambient, at a temperature greater than 350° C.

10. The method of claim 1, wherein said anneal procedure is performed in a nitrogen—hydrogen ambient, at a temperature between about 200 to 300° C., for a time between about 15 to 45 min.

11. A method of fabricating a copper structure, on a semiconductor substrate, comprising the steps of:
   forming an opening in an insulator layer, exposing a portion of a top surface of an underlying conductive region, located at the bottom of said opening;

depositing a barrier layer;

depositing a thick copper layer, between about 6000 to 9000 Angstroms in thickness, completely filling said opening, in said insulator layer, and with a portion of said thick copper layer residing on top surface of said barrier layer in a region in which said barrier layer overlays the top surface of said insulator layer;

forming a thin $CuSi_x$ compressive layer, between about 200 to 500 Angstroms in thickness, on the top surface of said thick copper layer; and removing said thin $CuSi_x$ compressive layer, removing the portion of said thick copper layer from the top surface of said barrier layer, and removing the portion of said barrier layer from the top surface of said insulator layer, creating said copper structure, in said opening in said insulator layer.

12. The method of claim 11, wherein said insulator layer is either a silicon oxide layer, a borophosphosilicate glass (BPSG) layer, or a carbon doped silicon oxide layer, each obtained via LPCVD or PECVD procedures, at a thickness between about 2000 to 5000 Angstroms.

13. The method of claim 11, wherein said opening in said insulator layer, is created via a RIE procedure, using $CHF_3$ as an etchant for said insulator layer.

14. The method of claim 11, wherein the width of said opening, in said insulator layer, is between about 1500 to 250 Angstroms.

15. The method of claim 11, wherein said barrier layer is either a tantalum nitride, or a titanium nitride layer, obtained via plasma vapor deposition procedures at a thickness between about 200 to 500 Angstroms.

16. The method of claim 11, wherein said thick copper layer is obtained via electro-chemical deposition procedures.

17. The method of claim 11, wherein said thin $CuSi_x$ compressive layer with a compressive stress between about 1E9 to 3E9 dynes/cm², is formed via exposure of copper to a silane ambient, at a temperature greater than 350° C.

18. A method of fabricating a narrow copper line structure, on a semiconductor substrate, featuring the use of a low temperature anneal procedure applied to a thick copper layer between about 6000 to 9000 Angstroms in thickness, overlaid with a thin compressive layer between about 200 to 500 Angstroms in thickness, prior to defining said narrow copper line structure via a chemical mechanical polishing, (CMP), procedure, comprising the steps of:

forming a narrow width opening, in an insulator layer, exposing a portion of a top surface of an underlying conductive structure;

depositing a barrier layer on: the sides of said opening in said insulator layer; on the portion of top surface of said underlying conductive structure; and on a top surface of said insulator layer;

depositing said thick copper layer, with a first portion of said copper layer filling said opening in said insulator layer, and with a second portion of said thick copper layer overlaying the portion of said barrier layer residing on the top surface of said insulator layer;

forming said thin compressive layer on said thick copper layer;

performing said low temperature anneal procedure to reduce the susceptibility to voids in said thick copper layer; and performing said CMP procedure: removing said thin compressive layer from the top surface of said thick copper layer: removing said second portion of said copper layer from the top surface of said barrier layer; and removing said barrier layer from the top surface of said insulator layer, creating said narrow copper line structure in said narrow opening in said insulator layer.

19. The method of claim 18, wherein said insulator layer is either a silicon oxide layer, a borophosphosilicate glass (BPSG) layer, or a carbon doped silicon oxide layer, each obtained via LPCVD or PECVD procedures, at a thickness between about 2000 to 5000 Angstroms.

20. The method of claim 18, wherein the width of said narrow opening, in said insulator layer, is between about 1500 to 2500 Angstroms.

21. The method of claim 18, wherein said barrier layer is either a tantalum nitride, or a titanium nitride layer, obtained via plasma vapor deposition procedures at a thickness between about 200 to 500 Angstroms.

22. The method of claim 18, wherein said thick copper layer is obtained via electro-chemical deposition procedures.

23. The method of claim 18, wherein said thin compressive layer is either a silicon oxynitride layer, or a silicon nitride layer, obtained via LPCVD or PECVD procedures, with a compressive stress, between about 1E9 to 3E9 dynes/cm².

24. The method of claim 18, said thin compressive layer is a tantalum nitride layer, obtained via plasma vapor deposition procedures, and with a compressive stress between about 1E9 to 3E9 dynes/cm².

25. The method of claim 18, wherein said thin compressive layer is a $CuSi_x$ layer, with a compressive stress between about 1 E9 to 3E9 dynes/cm², obtained via exposure of copper to a silane ambient, at a temperature greater than 350° C.

26. The method of claim 18, wherein said low temperature anneal is performed in a nitrogen—hydrogen ambient, at a temperature between about 200 to 300° C., for a time between about 15 to 45 min.

* * * * *